United States Patent
Phan et al.

(10) Patent No.: US 6,339,955 B1
(45) Date of Patent: Jan. 22, 2002

(54) THICKNESS MEASUREMENT USING AFM FOR NEXT GENERATION LITHOGRAPHY

(75) Inventors: Khoi A. Phan, San Jose; Bharath Rangarajan, Santa Clara; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/540,251

(22) Filed: Mar. 31, 2000

(51) Int. Cl.$^7$ .............................. G01B 5/28; H01J 37/26
(52) U.S. Cl. .......................................... 73/105; 250/306
(58) Field of Search ........................... 73/105; 250/306, 250/307; 430/14

(56) References Cited

U.S. PATENT DOCUMENTS

| | | | |
|---|---|---|---|
| 5,569,392 A | * 10/1996 | Miyoshi et al. ................ 216/60 |
| 5,828,432 A | * 10/1998 | Shashidhar et al. ......... 349/139 |
| 5,861,624 A | * 1/1999 | Alexander et al. .......... 250/306 |
| 5,955,661 A | 9/1999 | Samsavar et al. ............. 73/105 |
| 6,107,561 A | * 8/2000 | Thompson ................... 136/252 |
| 6,169,127 B1 | * 1/2001 | Lohmann et al. ........... 523/106 |
| 6,171,737 B1 | * 1/2001 | Phan et al. .................... 430/30 |
| 6,171,977 B1 | * 1/2001 | Kasai et al. ................. 438/775 |

OTHER PUBLICATIONS

"High Resolution Structure Imaging of Octahedral Void Defects in As–Grown Czochralski Silicon", *Jpn. J. Appl. Phys.*, vol. 36 (1997) pp. L1217–L1220, Part 2. No. 9A/B, Sep. 15, 1997.

"Light Point Defects on Hydrogen Annealed Silicon Wafer", *Jpn. J. Appl. Phys.*, vol. 36 (1997), pp. L1127–L1129, Part 2, No. 9A/B, Sep. 15, 1997.

"A New Method for Transmission Electron Microscope Observation of Grown–in Defects in As–Grown Czochralski Silicon (111) Crystals", *Jpn. J. Appl. Phys.*, vol. 36 (1997), pp. 6200–6203, Part 1, No. 10, Oct. 1997.

"Atomic Force Microscope Observation of the Change in Shape and Subsequent Disappearance of 'Crystal–Oriented Particles' after Hydrogen–Atmosphere Thermal Annealing", *Jpn. J. Appl. Phys.*, vol. 37 (1998), pp. 1–4, Part 1, No. 1, Jan. 1998.

* cited by examiner

Primary Examiner—Hezron Williams
Assistant Examiner—Michael Cygan
(74) Attorney, Agent, or Firm—Eschweiler & Associates, LLC

(57) ABSTRACT

The present invention relates to a method of determining a film thickness and comprises identifying a depth associated with a defect in an underlying material and forming the film over the underlying material. The method further comprises identifying a depth associated with the defect in the film and then using the identified depths to determine the film thickness. The present invention also relates to a system for determining a film thickness and comprises a defect inspection tool operable to identify a location of one or more defects in an underlying material and a topology measurement tool operable to measure a change in topology of a surface. The system also comprises a controller operably coupled to the defect inspection tool and the topology measurement tool. The controller is adapted to receive location information from the defect inspection tool relating to the one or more defects and use the location information to generate and transmit one or more control signals to the topology measurement tool to evaluate a topology of an underlying material and a film at the location corresponding to the one or more defect to thereby generate topology information. Lastly, the controller is adapted to receive the topology information form the topology measurement tool and determine a film thickness using the topology information.

14 Claims, 5 Drawing Sheets

THICKNESS MEASUREMENT USING AFM FOR NEXT GENERATION LITHOGRAPHY

FIELD OF THE INVENTION

The present invention relates generally to lithography and more particularly relates to a system and method for measuring films associated with lithography processes or other type semiconductor fabrication processes.

BACKGROUND OF THE INVENTION

In the semiconductor industry there is a continuing trend toward higher device densities. To achieve these high densities there has been, and continues to be, efforts toward scaling down the device dimensions on semiconductor wafers. In order to accomplish such a high device packing density, smaller features sizes are required. This may include the width and spacing of interconnecting lines and the surface geometry such as the comers and edges of various features.

The requirement of small features with close spacing between adjacent features requires high resolution photolithographic processes. In general, lithography refers to processes for pattern transfer between various media. It is a technique used for integrated circuit fabrication in which, for example, a silicon wafer is coated uniformly with a radiation-sensitive film (e.g., a photoresist), and an exposing source (such as ultraviolet light, x-rays, or an electron beam) illuminates selected areas of the film surface through an intervening master template (e.g., a mask or reticle) to generate a particular pattern. The exposed pattern on the photoresist film is then developed with a solvent called a developer which makes the exposed pattern either soluble or insoluble depending on the type of photoresist (i e., positive or negative resist). The soluble portions of the resist are then removed, thus leaving a photoresist mask corresponding to the desired pattern on the silicon wafer for further processing.

As process designers continue to shrink the size of the features which make up various semiconductor components, various process parameters must be tightly controlled. For example, in order to provide small, repeatable feature sizes, the thickness of various films such as photoresist layers and anti-reflective coatings (ARCs) must be small and uniform about the surface of the wafer. Consequently, process designers regularly measure the thickness of such films.

Film thicknesses typically are determined using characterization equations provided by the tool manufacturers which use various film material constants such as absorption coefficients and optical constants such as the index of refraction. Using such equations, process developers can implement various tests and take various parametric measurements, insert the measured data into the equations, and calculate an approximate film thickness. Although such thickness determination techniques are modestly accurate, the characterization equations require that the various film material constants which characterize the film be known. For newly developed materials such as next generation photoresists and ARC materials, such advanced characterization data is not easily available, thus making the determination of such film thicknesses difficult.

SUMMARY OF THE INVENTION

The present invention relates to a system and method of measuring accurately a film thickness without the use of film material characterization data.

According to one aspect of the present invention, the system and method of measuring a film thickness includes identifying a location of a defect, for example, a crystalline defect, in an underlying material such as a semiconductor substrate. Using the defect location information, the depth or height of the defect is measured using, for example, a topography evaluation tool. After the film to be measured is formed over the underlying material, the defect, which is reproduced in the overlying film, is again measured to identify the depth or height associated therewith. Using the measured pre-film and post-film defect depth data, the film thickness is determined. The present invention avoids the need to have characterization data associated with the film to be measured and thereby facilitates process development using new and/or advanced film materials.

According to another aspect of the present invention, a method of determining a film thickness includes identifying a location of one or more defects such as pits or crystal-originated particle defects in a material such as a semiconductor wafer. Once the defect location(s) is identified, the location data is used to measure the depth or height of the defect(s). Subsequently, the film to be measured is formed over the material and, because the film generally is conformal, the defect(s) is reproduced therein. Again, using the defect location data, the depth or height of the defect(s) are measured. The defect depth/height data (both prior to film formation and after film formation) is then utilized to calculate the film thickness without the need of characterization data related to the film material. In addition, if multiple defects exist, the multiple data points may be utilized to determine an average film thickness along with other statistical data.

According to another aspect of the present invention, a system for determining a film thickness is disclosed. The system includes a defect inspection tool, a topography measurement tool and a processor. The defect inspection tool evaluates an underlying material such as a semiconductor substrate to identify a location associated with one or more defects and transmits the location data to the processor. The processor then uses the location data to control the positioning of the topography measurement tool in order to collect depth or height data. The topography measurement tool identifies the depth or height associated with the one or more defects and transmits the defect depth/height data to the processor. After the film to be measured is formed over the underlying material, the processor and topography measurement tool again interface to collect the defect depth/height data associated with the one or more defects which are reproduced in the overlying film. Using the defect depth/height data, the processor determines the film thickness without the need for film characterization data, thus substantially facilitating process development associated with new materials.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
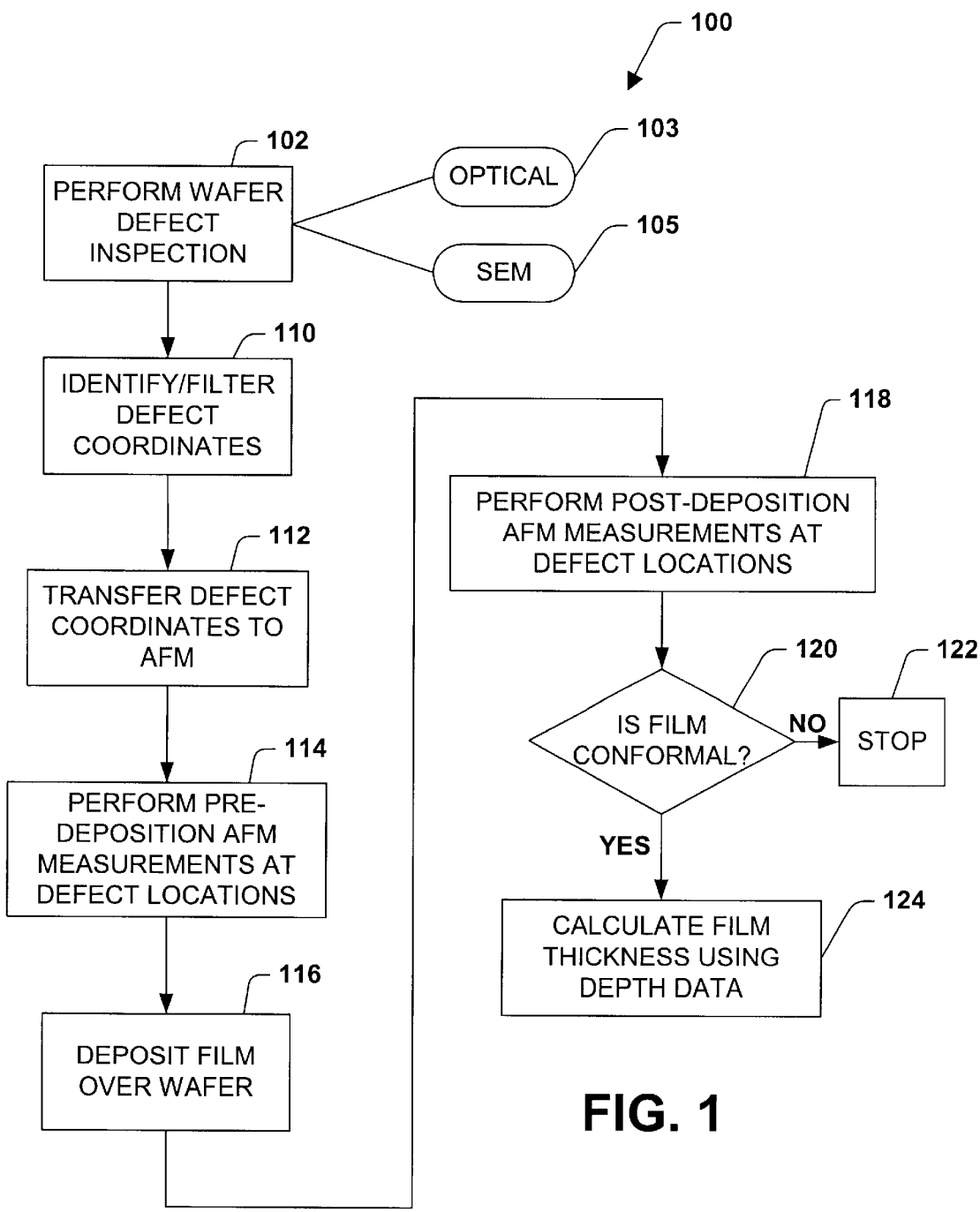
FIG. 1 is a flow chart diagram illustrating a method of determining a film thickness according to the present invention.

The following is a detailed description of the present invention made in conjunction with the attached Figures, wherein like reference numerals will refer to like elements throughout. The present invention includes a system and method of determining a film thickness without using film characterization data The film thickness is determined preferably by identifying a crystal-originated particle (COP) defect in an underlying material such as a blank silicon wafer and measuring the COP depth. The film to be measured is then formed over the underlying material and again the COP depth or height is measured. Using the depth/height data associated with the COP both before and after the film formation, the film thickness is determined.

Turning now to the Figures, FIG. 1 is a flow chart illustrating a method 100 of measuring a film thickness according to the present invention. The method 100 begins at step 102 by performing a defect inspection of an underlying material. According to the present example, the underlying material is a blank wafer and the defect inspection comprises looking for COP-type defects associated therewith. Alternatively, however, any material or film having one or more measurable defects (not solely COPs) associated therewith may be utilized and is contemplated as falling within the scope of the present invention.

Figure 2:
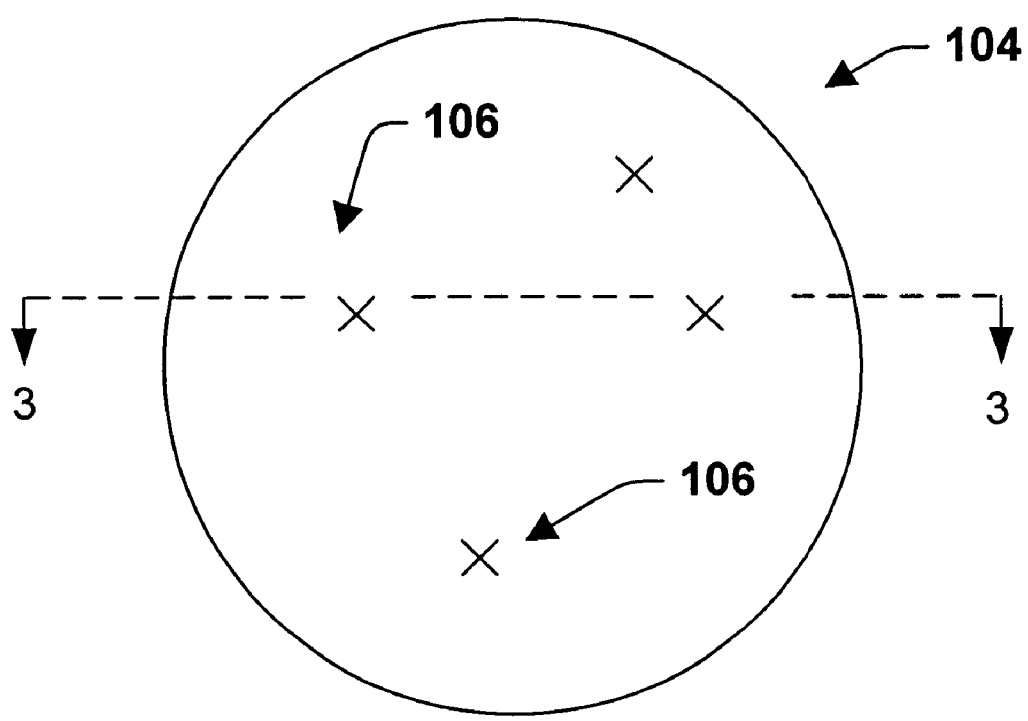
FIG. 2 is a plan view of a wafer illustrating a plurality of crystal-originated particle defects thereon.
Figure 3:
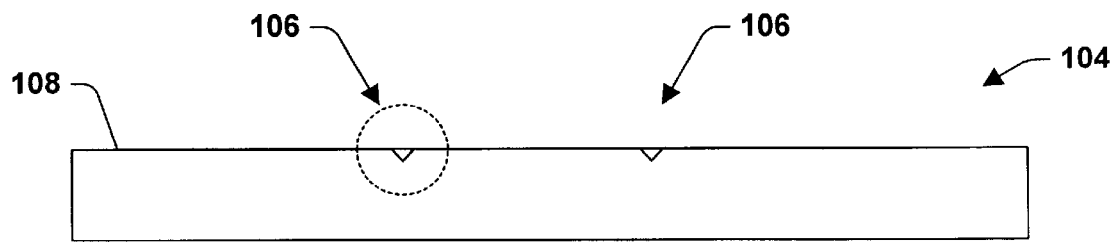
FIG. 3 is a cross section diagram illustrating the wafer of FIG. 2 taken along dotted line 3—3.
Figure 4:
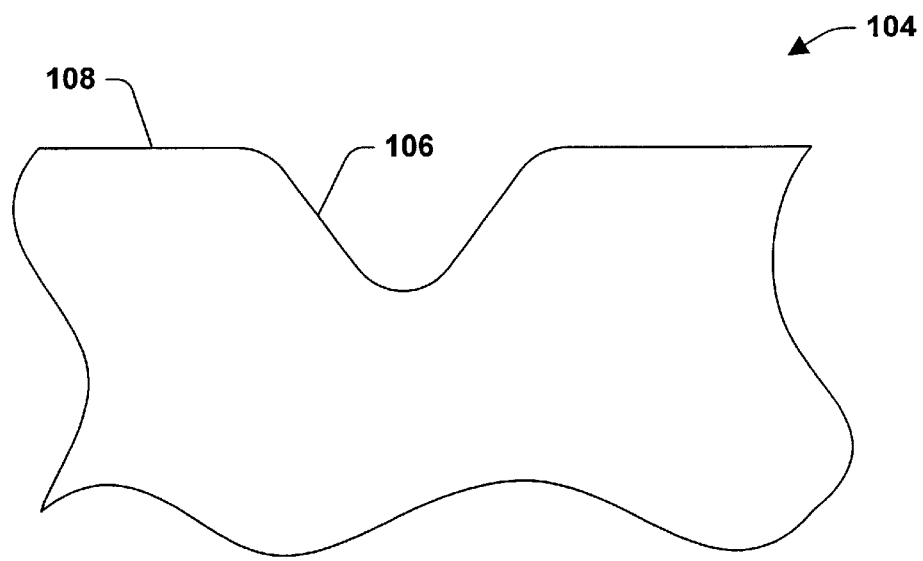
FIG. 4 is a fragmentary cross section diagram illustrating in greater detail an exemplary crystal-originated particle defect.

FIG. 2 is a plan view illustrating a wafer 104 having a plurality of COPs 106 associated therewith. COPs are believed to be defects associated with a wafer which are grown-in and consist of incomplete octahedral voids and thin $SiO_x$ walls of several nanometers surrounding the respective voids. Consequently, the COPs 106 resemble small pits on the surface 108 of the wafer 104, as illustrated in FIGS. 3 and 4, respectively.

The purpose of the defect inspection step 102 is to identify a location of one or more defects on the underlying material (e.g., the wafer 104) (step 110) so that the location information may be used subsequently to position a measurement tool for characterizing the defects. Accordingly, any manner of inspecting the wafer 104 may be utilized, for example, using an optical inspection tool such as a KLA-Tencor 2138 Brightfield Inspection System or a SP1 Surfscan®, or a scanning electron microscope (SEM). According to the present invention, the size of the defect is preferably the same order of magnitude as the film thickness to be measured. Consequently, step 110 further includes a filtering step, wherein only those defects of a predetermined size will be evaluated. For example, if the film to be measured is a photoresist film of about 0.1 micron (1000 Angstroms), only those defects having a size of about 0.1 micron or less will be evaluated.

If the type of defect(s) to be identified are COP-type defects, it is preferred that both an optical tool and an SEM be used since an optical tool will locate COPs both on the surface and embedded within the material to a depth of about several hundred nanometers. Using an SEM in conjunction with an optical tool, the embedded COPs can be "filtered out" so that only those COPs which are on the surface will be identified for subsequent characterization.

Once the coordinates for the "filtered" defects are identified at step 110, the defect coordinates are transferred to a topography measurement tool such as an atomic force microscope (AFM) at step 112. Such defect location information may be in the form of X-Y coordinates, for example, $(X_1, Y_1), (X_2, Y_2), \ldots (X_n, Y_n)$ for "n" identified defects. Any form of location information, however, may be employed and is contemplated as falling within the scope of the present invention.

Using the defect location information, the method 100 continues at step 114 by measuring at least the depth or height of one or more of the identified defects. According to one example of the invention, the depth or height of the defects is measured by a topography measurement tool such as an AFM (e.g., $h_1(X_1, Y_1), h_1(X_2, Y_2), \ldots h_1(X_n, Y_n)$, wherein $h_1$, represents the pre-film defect depth/height for the respective defects). Subsequently, the film to be measured (e.g., a photoresist film) is formed over the underlying material (e.g., the wafer 104) at step 116 and again the defect depths/heights are measured at step 118 (e.g., $h_2(X_1, Y_1), h_2(X_2, Y_2), \ldots h_2(X_n, Y_n)$, wherein $h_2$ represents the post-film depth for the respective defects).

Upon collecting the post film deposition defect depth/height data, a preferred step of determining whether the film is conformal with respect to the defects (step 120) is conducted. If the film is determined not to be conformal (NO at step 120), the method 100 preferably is discontinued at step 122 because (as will be discussed in greater detail infra) the conclusion based on the use of the collected defect data may not be reliable. Alternatively, however, if the film is determined to be conformal (YES at step 120), then the collected defect depth/height data is used to determine the film thickness at step 124.

Figure 5:
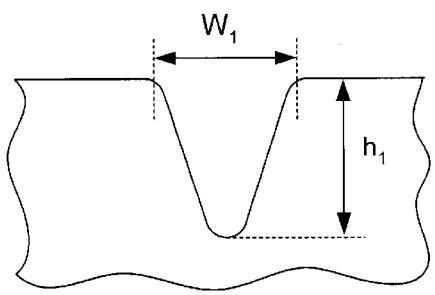
FIG. 5 is a fragmentary cross section diagram illustrating a depth/height and width associated with an exemplary crystal-originated defect.
Figure 6:
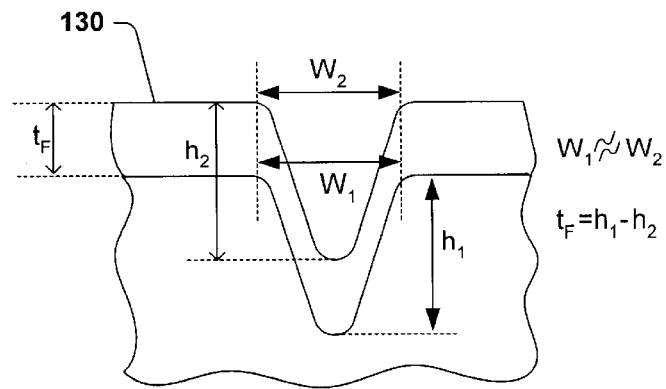
FIG. 6 is a fragmentary cross section diagram illustrating a depth/height and width associated with a crystal-originated defect and a film lying thereover, respectively.
Figure 7A:
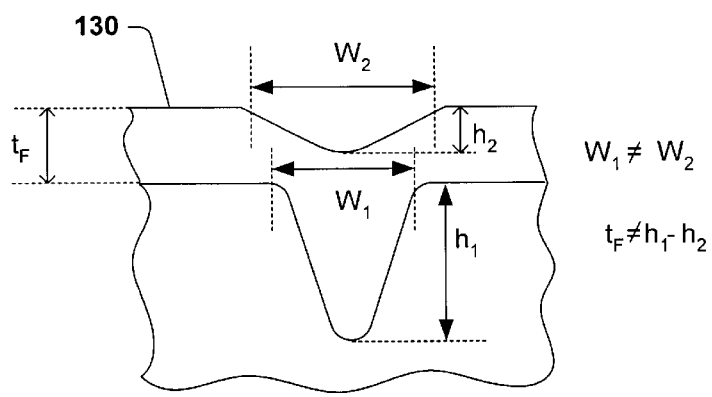
FIG. 7a is a fragmentary cross section diagram illustrating a depth/height and width associated with a crystal-originated defect and a film lying thereover, respectively.
Figure 7B:
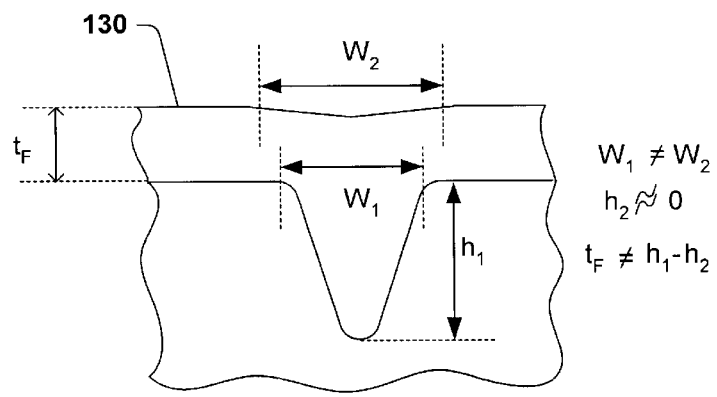
FIG. 7b is a fragmentary cross section diagram illustrating a depth/height and width associated with a crystal-originated defect and a film lying thereover, respectively.

Preferably, the conformality check at step 120 is employed to ensure that the defect depth/height measurements, upon their use in subsequent calculations, will render reliable results. An exemplary conformality check is illustrated in FIGS. 5–7b, respectively. In FIG. 5, a defect such as a COP is illustrated having a depth/height $h_1$ and a width $W_1$. Upon the formation of the film 130 to be measured, the defect is again measured having a depth/height $h_2$ and a width $W_2$. If the width $W_2$ is approximately the same as the pre-film defect width $W_1$ ($W_1 \approx W_2$), then the film 130 is generally conformal, and the difference in the defect depth/height $\Delta h$ reflects the film thickness ($\Delta h = t_f = h_1 - h_2$) provided that the defect width $W_1$ is generally about the expected thickness of the film 130, as illustrated in FIG. 6. If, however, the post-film width $W_2$ is not approximately the pre-film width $W_1$, then the difference in defect depth/height $\Delta h$ does not accurately reflect the film thickness, as illustrated in FIG. 7a. Similarly, if the film thickness is such that the entire defect area is filled ($h_2 \approx 0$), then the difference in defect depth/height will not accurately reflect the film thickness, as illustrated in FIG. 7b.

In the present invention, COPs are utilized in a preferred example because their width generally is consistent in the vicinity of about 0.1 micron and various advanced thin film photoresists under development are in the range of about 50–100 nm. Therefore use of COPs to determine photoresist film thicknesses will work effectively. Consequently, it is advantageous to filter out defects during defect inspection (as discussed briefly supra) that are too large or too small with respect to the expected film thickness of the film to be measured. The present invention, however, is equally applicable to other types of films and film thicknesses. In such cases, different type defects may be utilized and such variations are contemplated as falling within the scope of the present invention.

Figure 8:
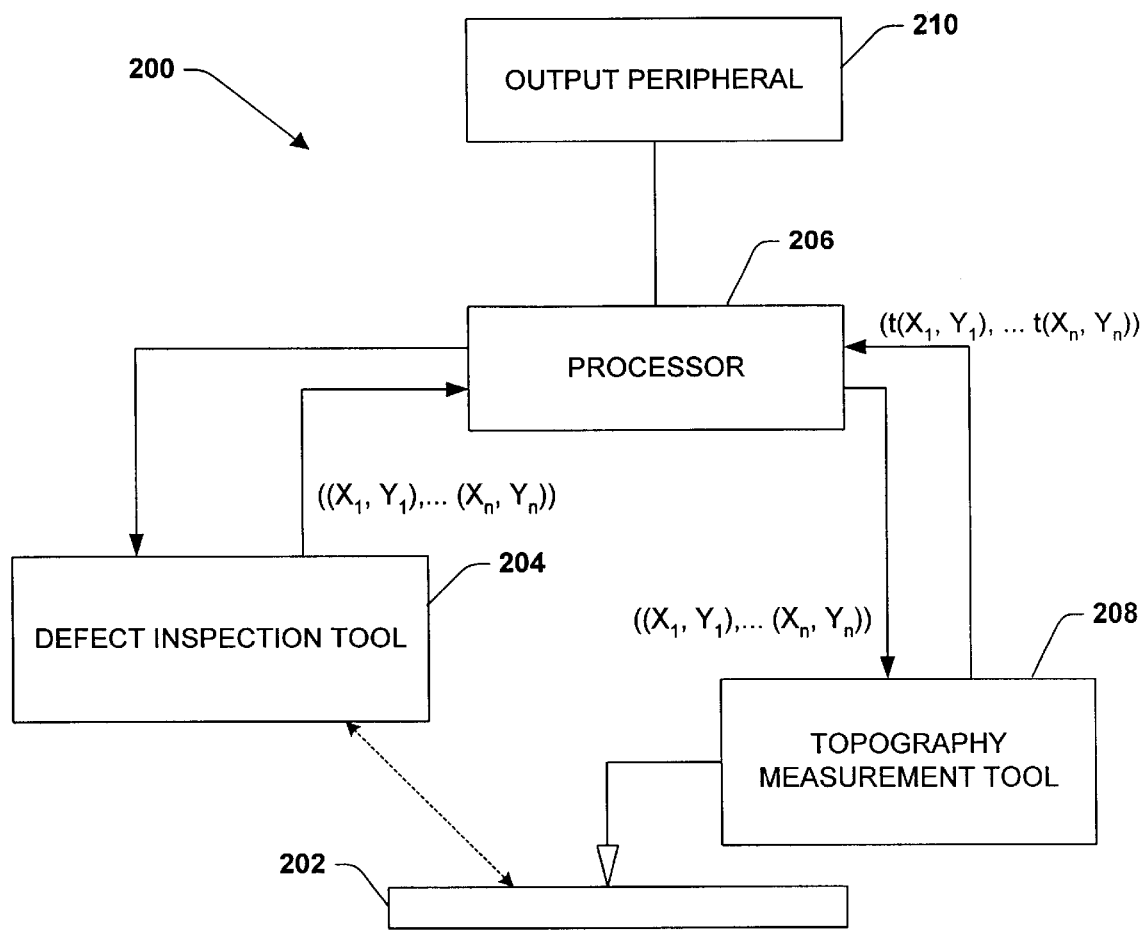
FIG. 8 is a system for determining a film thickness according to the present invention.

In accordance with another aspect of the present invention, a system for determining a film thickness is disclosed, as illustrated in FIG. 8 and designated at reference numeral 200. In the system 200, an underlying material such as a wafer 202 has one or more defects associated therewith on its surface. A defect inspection tool 204 is operably coupled to the wafer 202, and is operable to identify the location associated with the wafer defects. Such a defect inspection tool may include an optical tool and/or an SEM, however, any tool for identifying defects may be utilized and is contemplated as falling within the scope of the present invention.

The defect inspection tool 204 operates in conjunction with a processor 206, wherein in response to one or more control signals from the processor 206, the defect inspection tool 204 identifies one or more defects and communicates location information (e.g. $(X_1, Y_1), (X_2, Y_2), \ldots (X_n, Y_n)$) to the processor 206. The processor 206 is also operably coupled to a topography measurement tool 208, such as an AFM. Although an AFM is disclosed in the above example, any type of topography tool (e.g., a scanning probe microscope) or other type defect measurement device may be utilized and is contemplated as falling within the scope of the present invention. In operation, the processor 206 communicates the location information to the topography measurement tool 208 which uses the location information to position the tool for measurement of the various defects.

The system 200 also may include an output peripheral 210 operably coupled to the processor 206 which allows a user to view the collected data in a variety of formats (e.g., tabular data, graphical or other), as may be desired.

The system 200 operates generally in the following exemplary manner. The processor 206 transmits one or more control signals to the defect inspection tool 204 in order to initiate the collection of defect location information. The defect inspection tool 204 then performs the defect inspection and identifies positional indicia associated with each of the defects. In the exemplary embodiment where COP-type defects associated with a blank silicon wafer are used, the defect inspection tool is an optical inspection tool and is used to identify any defects less than or equal to about 0.1 micron, with the larger defects being "filtered out" or otherwise ignored. Because an optical tool is capable, in some cases, of detecting COP-type defects both on the wafer surface and within the wafer to a depth of a couple hundred Angstroms, an SEM is also used in conjunction with the optical tool to separate out those COPs which are embedded in the wafer 130.

The defect inspection tool 204 may itself filter out any defects outside an acceptable size or it may transmit all location data to the processor 206 for subsequent filtering. In any event, the processor 206 transmits the location data along with one or more control signals to the topography measurement tool 208. The tool 208 takes the data and in accordance with the control signals takes measurements at each defect location. According to the present example, such measurements include both the depth and the width of each defect, and such information is transmitted either back to the processor 206 or to a memory (not shown) which is accessible by the processor 206.

Once the data associated with the pre-film defects has been collected, the film to be measured is formed on the wafer 202 (or any other type substrate) and, again using the defect location information, the post-film defect data (preferably the depth/height and width) is collected and transferred to the processor 206. The processor 206 then utilizes the pre-film and the post-film defect data to calculate the film thickness.

Preferably, the processor 206 first uses (according to its programming or physical configuration) the defect width data to determine whether the film is conformal with respect to the various defects. As discussed supra, it is desirable to ensure that the film is generally conformal in order to ensure the resulting data is reliable. The processor 206 checks the conformality by comparing the width of the various defects before and after the film formation. If the post-film width $W_2$ is within a predetermined range or percentage of the pre-film width $W_1$, then the film is considered to be conformal. Otherwise, the film is not sufficiently conformal and the depth may be considered unreliable.

Once the conformality check is complete, the processor 206 determines the film thickness by subtracting the post-film defect depth/height $h_2$ from the pre-film depth/height $h_1$ ($t_F = h_1 - h_2$). In order to calculate an average, the thickness associated with multiple defects can be averaged and other statistical methods may be employed to analyze the data, as may be desired. The results are then sent by the processor 206 to the output peripheral 210 for review.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description and the claims, such term is intended to be inclusive in a manner similar to the term "comprising."

What is claimed is:

1. A method of estimating a film thickness, comprising the steps of:

identifying a depth associated with a defect in an underlying material, wherein the defect has a width characteristic that is within an order of magnitude of an estimated thickness of a film to be analyzed;

forming the film over the underlying material;

identifying a depth associated with the defect in the film;

using the identified depths to estimate the film thickness;

determining whether the film is conformal with respect to the plurality of defects; and discontinuing the method if the film is not conformal.

2. The method of claim 1, wherein identifying the depth associated with the defect comprises:

scanning the underlying material with a probe to identify the defect associated therewith; and determining the depth of the identified defect using the probe.

3. The method of claim 2, wherein scanning the underlying material with a probe comprises scanning the underlying material with a tip of an atomic force microscope.

4. The method of claim 3, wherein determining the depth of the identified defect comprises monitoring a movement of the tip at a location associated with the defect.

5. The method of claim 1, wherein the underlying material comprises a semiconductor substrate.

6. The method of claim 1, wherein determining whether the film is conformal comprises:

determining a width associated with one or more of the plurality of defects in the underlying material;

determining a width associated with one or more of the plurality of defects in the film; and determining whether the defect width associated with the one or more defects in the film is within a predetermined range or percentage of the defect width associated with one or more defects in the underlying material.

7. The method of claim 1, wherein the film comprises a photoresist film or an anti-reflective coating type film.

8. The method of claim 1, wherein identifying the depth associated with the defect in the underlying material comprises the step of:

inspecting the underlying material with an optical inspection tool to identify a location of the defect associated therewith; and scanning the location with a tip of an atomic force microscope, wherein an amount of deflection of the tip corresponds generally to the depth of the defect.

9. The method of claim 8, wherein identifying the depth associated with the defect in the film comprises scanning the location with a tip of an atomic force microscope.

10. The method of claim 9, wherein using the identified depths to estimate the film thickness comprises subtracting the defect depth in the film from the defect depth in the underlying material.

11. A method of estimating a film thickness, comprising the steps of:

identifying a plurality of defects associated with an underlying material;

determining a depth associated with each of the plurality of defects in the underlying material;

forming the film over the underlying material;

determining whether the film is conformal with respect to the plurality of defects;

discontinuing the method if the film is not conformal;

determining a depth associated with each of the plurality of defects in the film;

using the identified depths to estimate the film thickness.

12. The method of claim 11, wherein determining whether the film is conformal comprises:

determining a width associated with one or more of the plurality of defects in the underlying material;

determining a width in the film associated with one or more of the plurality of defects; and determining whether the width in the film associated with the one or more defects is within a predetermined range or percentage of the width associated with one or more defects in the underlying material.

13. A system for estimating a film thickness, comprising:

a defect inspection tool operable to identify a location of one or more defects in an underlying material;

a topography measurement tool operable to measure a change in topography of a surface; and a controller operably coupled to the defect inspection tool and the topography measurement tool, wherein the controller is adapted to receive location information from the defect inspection tool relating to the one or more defects and use the location information to generate and transmit one or more control signals to the topography measurement tool to evaluate a topography of an underlying material and a film at the location corresponding to the one or more defects to thereby generate topography information, and further wherein the controller is adapted to receive the topography information from the topography measurement tool and estimate a film thickness using the topography information, and wherein the controller is further adapted to calculate a depth of the one or more defects in the underlying material and a depth of the one or more defects in the film using the topography information and calculate a film thickness at each of the one or more defects by subtracting the depth of the one or more defects in the underlying material from the depth of the one or more defects in the film.

14. The system of claim 13, wherein the controller is further operable to calculate an average film thickness using the film thickness at each of the one or more defects.

* * * * *